United States Patent [19]
Brunner

[11] 3,995,237
[45] Nov. 30, 1976

[54] AUTOMATIC MATCHING METHOD AND APPARATUS

[75] Inventor: John E. Brunner, Hamilton, Ohio

[73] Assignee: Cincinnati Electronics Corporation, Cincinnati, Ohio

[22] Filed: Feb. 13, 1975

[21] Appl. No.: 549,820

[30] Foreign Application Priority Data
Oct. 15, 1974 United Kingdom............... 44583/74

[52] U.S. Cl. .............................. 333/17 M; 333/32
[51] Int. Cl.² .......................................... H03H 7/40
[58] Field of Search .................. 333/17 R, 17 M, 32; 325/174, 177

[56] References Cited
UNITED STATES PATENTS

| | | | |
|---|---|---|---|
| 2,745,067 | 5/1956 | True et al. | 333/17 M X |
| 3,390,337 | 6/1968 | Beitman, Jr. | 333/17 X |
| 3,443,231 | 5/1969 | Roza | 333/17 M X |
| 3,794,941 | 2/1974 | Templin | 333/17 M |
| 3,891,947 | 6/1975 | Debost et al. | 333/17 M |

*Primary Examiner*—Paul L. Gensler
*Attorney, Agent, or Firm*—Lowe, King, Price & Markva

[57] ABSTRACT

A high-Q load circuit is matched to a drive circuit with an L-type filter network including series and shunt reactances which are both either inductive or capacitive. While a first of the reactances is effectively removed from the network, the value of the second of the reactances is varied until the impedance magnitude of the load and network, as seen from the drive circuit, reaches a predetermined magnitude, and a predetermined relationship exists for the polarity of the phase of the voltage and current supplied by the drive circuit to the network. When the impedance magnitude seen by looking from the drive circuit into the network reaches the predetermined magnitude and the correct phase polarity exists, the first reactance is reconnected into the network and then varied until a predetermined relationship exists between the phase angle between the voltage and current applied by the drive circuit to the network.

40 Claims, 6 Drawing Figures

AUTOMATIC MATCHING METHOD AND APPARATUS

FIELD OF THE INVENTION

The present invention relates generally to an apparatus for and a method of matching a load circuit to a drive circuit and more particularly to a matching method and apparatus in which the value of a reactance of a matching network is varied until a predetermined impedance magnitude is seen at output terminals of the drive circuit while the network is adjusted so that a real component of impedance as seen at the output terminals is maintained constant.

BACKGROUND OF THE INVENTION

One prior art system for and method of automatically matching a drive circuit to a load circuit involves controlling series and shunt reactances of a matching network connected between the drive and load circuits. The reactances are controlled in response to indications of (a) the resistance seen looking into the matching network from the drive circuit and (b) phase relationships of the voltage and current supplied by the drive circuit to the matching network. The network is adjusted so that the impedance seen looking from the drive circuit into the matching network moves along a line of constant conductance or constant resistance as the value of a first of the reactances is varied. The first reactance is varied until the resistance looking into the matching network from the drive circuit equals the output impedance of the drive circuit, which is equal to the desired characteristic impedance seen looking into the matching network from the drive circuit. The network is then adjusted so that the resistance or conductance seen looking into the matching network from the drive circuit remains constant despite variations of the second reactance. The second reactance is varied until the current and voltage supplied by the drive circuit to the network have the same phase, at which time a match is assumed to exist and no further variations of the reactances of the matching network occur.

In the case of a high-Q load, i.e., a load having a reactive impedance component on the order of 100 times greater than its resistive component, it is difficult to generate control voltages precisely indicative of the resistance seen looking into the matching network from the drive circuit. The difficulty arises because of the inherent nature of circuitry utilized for detecting the resistance. In particular, resistance detectors include current and voltage sampling impedance elements across which are derived control voltages proportional to the current flowing in the matching network and the voltage applied to the matching network by the drive circuit. These control voltages are linearly combined to derive a resultant voltage that is indicative of the vector sum of the current and voltage samples. The resultant voltage is detected by a rectifying network which generates an output control voltage indicating the sensed resistance magnitude.

For a high-Q load, where there is a great possibility of an appreciable difference between the phases of the load voltage and current with respect to the relative phases of the corresponding voltage samples, errors aree likely to be induced in the control voltages because of unavoidable stray reactances in the sampling circuits. If the matching network is to operate over a relatively wide frequency range, such as two decades from 2 to 8 mHz, the strays cannot be compensated so there is a relatively high percentage of unavoidable error in the resistance indicating control signal.

Because of the strays, accurate resistance detection is not feasible, in practice, for load circuits having Q's greater than approximately 10. With the prior art resistance detecting technique, the ratio of the imaginary (reactance or susceptance) component to real (resistance or conductance) component becomes rather large when the value of the first reactance has been adjusted so that the resistance seen looking into the matching network from the drive circuit reaches the desired value. For example, if it is desired to match a 50 ohm driving circuit to a load having an impedance:

$$Z_L = 0.1 + j24 \qquad 1.$$

where:

$Z_L$ = the load impedance, and $$j = \sqrt{-1,}$$

the impedance seen looking into the matching network is first transformed to:

$$Z_A = 50 + j534.3 \qquad 2.$$

where:

$Z_A$ = the impedance seen looking into the matching network from the drive circuit after the first reactance has been adjusted and prior to adjustment of the second reactance. Therefore, to provide a proper match between the load and drive circuit, the 50 ohm resistance component must be detected accurately to properly control the adjustment of the first reactance of the matching network.

If a standard, prior art resistance detector, as discussed above, is used to sense the resistive component, the accuracy of detection is given by:

$$\% \text{ error} = (X_A/R_o) \tan(\theta) \times 100 \qquad 3.$$

where:

$R_o$ = the resistive component to be detected ($R_o = R_A$ = 50 ohms in this example)

$X_A$ = Reactive component ($X_A$ = 534 ohms in this example)

$\theta$ = Relative phase angle between the current "I" and output voltage $V_I$ of the current sampling transformer. Because of the stray reactance in the resistance detector, there is usually a phase deviation of one or two degrees between the voltage and current samples and the control voltages which are vectorially combined to form the resultant. For a phase deviation of $\pm 1°$ between one of the samples and the control voltage responsive to the sample, Equation (3) yields a resistance error of $\pm 18$ %. Obviously, such a large error cannot be tolerated in a matching network that is expected to automatically and accurately couple a load circuit to a drive circuit with maximum efficiency in a stable manner.

Another disadvantage with the prior art resistance detector when used with high-Q circuitry, is that the sensitivity of such a detector is degraded when a large impedance is detected. The sensitivity of a resistance detector is:

$$\text{Sensitivity} = \frac{E_v K_i}{Z^2} \left(\frac{\text{Volts}}{\text{Ohms}}\right) \qquad (4)$$

where:

$E_L$ = voltage across the load impedance
$K_I$ = current sample constant = $(V_I/I)$
$|Z|$ = magnitude of load impedance ($Z = 536$ ohms for the above example)

From Equation (4), it is seen that the sensitivity of the resistance circuit is inversely proportional to approximately 29,000, whereby an extremely low voltage is derived from the resistance detector for large load impedances.

BRIEF DESCRIPTION OF THE INVENTION

In accordance with the present invention, the phase error and sensitivity problems associated with a resistance detector are obviated by using an impedance magnitude detector, in lieu of the resistance detector. In an impedance magnitude detector, R.F. voltage samples proportional to load current and voltage are immediately rectified and combined to derive a D.C. control voltage. Thereby, R.F. phase displacements between the load current and voltage and the corresponding voltage and current samples are not sources of error and strays do not appreciably affect the amplitude of the impedance detector output control voltage. Further, the D.C. control voltages proportional to the magnitudes of the current and voltage samples may be amplified to any convenient level prior to being combined. Thereby, circuits for sampling the current and voltage in the matching network can be very loosely coupled to a main line connecting the matching network to the driving circuit so that the impedance of a high impedance load is not significantly altered by taking the samples.

The primary restriction associated with an impedance magnitude discriminator is that the load and drive circuits cannot be theoretically matched to each other over a relatively wide frequency range. Instead, matching is possible only over a given range of voltage standing wave ratios (VSWR's). A typical range of VSWR's that can be matched is from 1:1 to 2:1, an acceptable limit for efficiently coupling drive and load circuits under most circumstances. The restriction of imperfect match is considered acceptable since the accuracy of the impedance detector completely negates the inability of the resistance detector to function accurately in connection with high-Q circuits and high impedance loads. Prior art attempts to use a resistance detector with a high-Q load were so inadequate that the Q of the load had to be reduced by a factor on the order of 20 to achieve matching.

As in the prior art, the matching network is initially adjusted so that the real component (conductance or resistance) seen by looking from the drive circuit into the matching circuit is maintained along a constant locus as the first reactance is varied. However in the present invention, the first reactance is varied until a predetermined impedance magnitude component of impedance, not equal to the drive circuit output or characteristic impedance, is detected. The predetermined impedance magnitude is a function of the characteristic impedance of the drive circuit and the conductance or resistance of the load. It will be shown infra that the predetermined impedance magnitude is also related to the maximum acceptable VSWR ($\sigma_m$) and the magnitude of the real component of the load impedance at the extremes of the frequency range over which the load is driven by the source. In particular, for a matching circuit including a series leg connected between the drive circuit and load and a shunt leg parallel to the terminals of the load, the predetermined impedance magnitude is:

$$|Z| = \left[\frac{\sigma_m Z_o}{G_{max}}\right]^{1/2} = \left[\frac{Z_o}{\sigma_m G_{min}}\right]^{1/2} \qquad (5)$$

where:

$Z_o$ = the output impedance of the drive circuit,
$G_{max}$ = load conductance at one end of the frequency range, where load conductance seen by the matching network is maximum, and
$G_{min}$ = load conductance at the other end of the frequency range, where load conductance is minimum.

If the matching network includes a series reactance and a shunt reactance in parallel to the source, rather than in parallel to the load, the predetermined impedance magnitude is:

$$|Z| = [\sigma_m Z_o R_{min}]^{1/2} = \left[\frac{Z_o R_{max}}{\sigma_m}\right]^{1/2} \qquad (6)$$

where:

$R_{min}$ = the resistance of the load at one end of the frequency range, where load resistance is a minimum, and
$R_{max}$ = load resistance at the other end of the frequency range, where load resistance is maximum.

After the predetermined impedance magnitude has been detected, the matching network is adjusted so that variations of the second reactance cause the inverse real component seen by looking from the drive circuit into the matching circuit to be maintained constant, despite variations of the second reactance. (The term "inverse real component" is defined as the reciprocal of the real component that is maintained constant as the first reactance is varied, i.e., if conductance is constant while the first reactance is varied, resistance is constant while the second reactance is varied, and alternatively if resistance is constant while the first reactance is varied conductance is constant while the second reactance is varied.) The value of the second reactance of the matching network is then varied until the voltage and current applied by the drive circuit to the matching network are in phase, i.e., the phase difference is zero. When an in phase relation occurs, a matched condition within the predetermined, designed range of acceptable VSWR's is reached. The worst match conditions, at the limits of the VSWR maximum acceptable ratio, are at the outer bounds of the frequency ranges, and intermediate frequencies are matched to a lower VSWR than the outer VSWR limits.

The phase detector, in addition to controlling the magnitude of the second reactance, can be utilized to resolve possible ambiguities in the impedance magnitude detector output. The impedance magnitude detector is capable of deriving the predetermined impedance magnitude output on both the inductive and capacitive sides of a Smith chart axis. If the matching network employs capacitive reactances, the first capacitor should be varied until the detected impedance magnitude is detected on the inductive (right side) of the Smith chart; in contrast, if the matching network employs inductive reactances, the value of the first inductance is varied until the predetermined impedance magnitude is detected on the capacitive (left) side of the Smith chart. The phase ambiguity associated with the impedance detector is resolved by sampling the phase detector output when the impedance detector derives an output equal to the predetermined impedance magnitude. If the possibility of ambiguity does not exist, the use of the phase detector for this purpose may be eliminated.

While I am aware of prior art devices and methods wherein matching between a load and drive circuit is achieved by varying reactances of the matching circuit in response to a detected impedance magnitude, these prior art systems do not appear to be particularly feasible for high-Q applications and many of them appear to be overly complex. In general, the prior art devices using impedance magnitude detectors appear to attempt to match a load with a drive source over the entire Smith chart, rather than merely over a portion of the chart. In the prior art devices using impedance magnitude detectors, it also appears that the reactances of the matching network are simultaneously, rather than sequentially, varied. There is a possibility that the simultaneous operation will prevent the matching network from ever reaching a stable condition.

It is accordingly, an object of the present invention to provide a new and improved apparatus for and method of automatically matching a load circuit to a drive circuit.

A further object of the present invention is to provide a new and improved apparatus for and method of matching a drive circuit to a load circuit wherein one of the circuits has a relatively high-Q.

A further object of the invention is to provide a new and improved automatic matching apparatus and method, particularly adapted for high-Q circuits, wherein the effects of stray reactances on samples utilized to derive control signals are substantially eliminated and relatively great sampling sensitivity can be attained without appreciably loading the circuit.

Still another object of the invention is to provide a new and improved apparatus for and method of automatically matching a relatively high-Q load or drive circuit to another circuit over a relatively wide frequency band, despite the use of an impedance magnitude detector.

Still another object of the invention is to provide a new and improved apparatus for and method of matching a load circuit to a drive circuit over a relatively wide frequency range within a predetermined VSWR range.

A further object of the present invention is to provide apparatus for and method of automatically matching a drive circuit to a load circuit by utilizing a sequentially activated impedance magnitude detector wherein ambiguities that might exist in detecting the impedance magnitude are resolved by sampling the phase of the current and voltage applied by the drive circuit to a matching network when a predetermined impedance is detected.

The above and still further objects, features and advantages of the present invention will become apparent upon consideration of the following detailed description of several specific embodiments thereof, especially when taken in conjunction with the accompanying drawing.

DETAILED DESCRIPTION OF THE DRAWING

Figure 1:
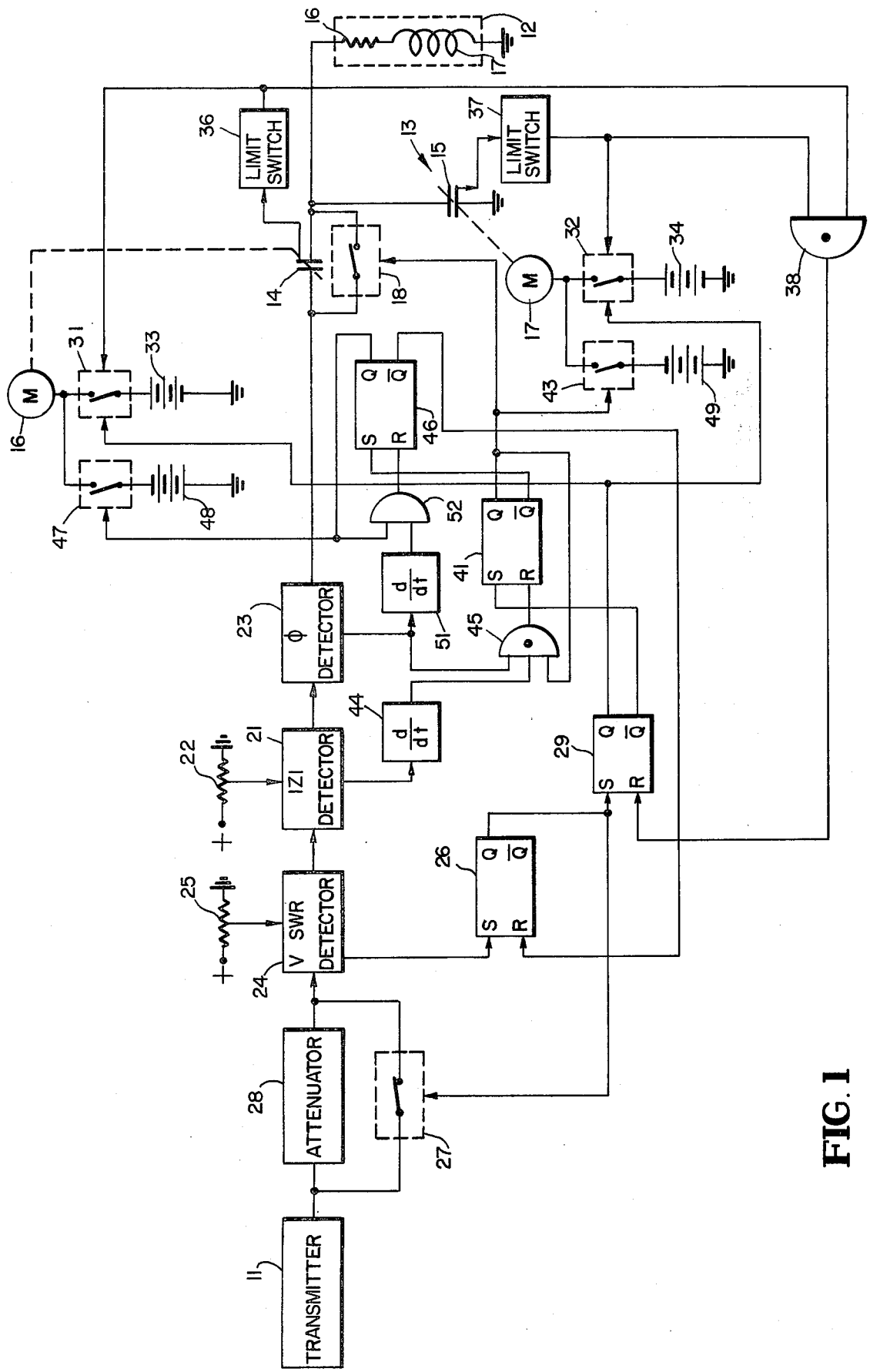
FIG. 1 is a block diagram of one embodiment of the present invention.
Figure 2:
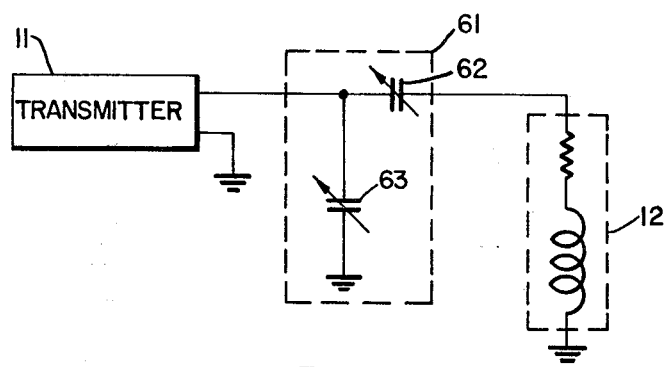
FIGS. 2–4 are circuit diagrams of alternate embodiments of the matching network.
Figure 3:
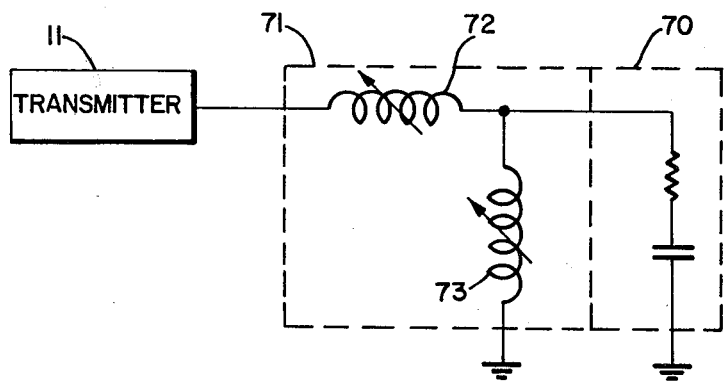
Figure 4:
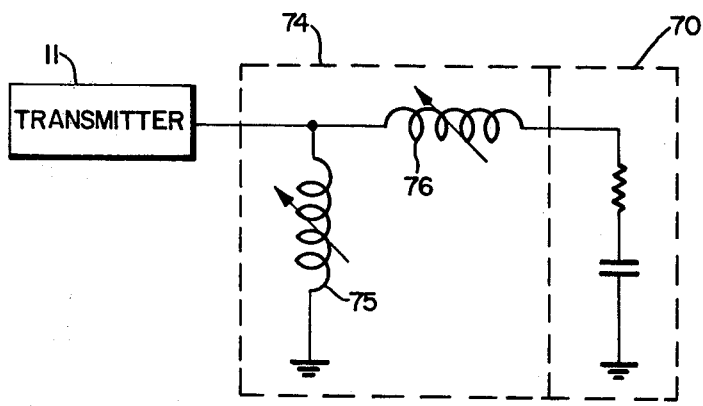

Reference is now made to FIG. 1 of the drawing wherein a drive circuit comprising transmitter 11 is connected to a load circuit 12, such as an antenna, by an L-type matching filter network 13. One or both of transmitter 11 and load circuit 12 have a high-Q and are capable of operating over a relatively wide bandwidth, such as the two decade range from 2 to 8 mHz. In the particular embodiment illustrated in FIG. 1, matching network 13 includes a series, variable capacitor 14 connected between an output terminal of transmitter 11 and one terminal of load 12 and a shunt, variable capacitor 15 connected in parallel with load 12. Capacitors 14 and 15 are utilized in matching network 13 because it is expected that load 12 is a high-Q, primarily inductive circuit including a resistance, represented by resistor 16, and an inductance, represented by inductor 17. However, it is to be understood that other types of matching networks can be employed, as illustrated by FIGS. 2–4 which are discussed in greater detail infra.

Automatic matching of circuits 11 and 12 with network 13, as illustrated in FIG. 1, is attained by detecting the impedance magnitude seen by looking from the output terminals of transmitter 11 into matching network 13 while series capacitor 14 is short-circuited. The value of capacitor 15 is varied to cause the admittance seen at the output of transmitter 11 to vary along a constant conductance locus.

In response to the impedance magnitude seen by looking into matching network 13 from transmitter 11 reaching a predetermined value, a check of the phase relationship between the voltage and current applied by transmitter 11 to matching network 13 is made. In response to the voltage leading the current, an indication is provided that the correct impedance magnitude value has been reached and further adjustment of capacitor 15 is terminated. If the voltage lags, rather than leads the current, the value of capacitor 15 is adjusted until the predetermined impedance value is again detected. When the predetermined impedance value is again detected, a check is made as to the phase relationship between the voltage and current applied by transmitter 11 to the matching network. In response to the voltage applied by transmitter 11 leading the current applied by the transmitter to the matching network, capacitor 14 is effectively connected in the circuit by removing the short circuit which was previously applied across it. Thereafter, the value of capacitor 14 is varied until the voltage and current applied by transmitter 11 to matching network 13 are in phase, i.e., the voltage and current have the same phase. Variations in the value of capacitor 14 are reflected in the output terminals of transmitter 11 as reactance and impedance variations that follow a constant resistance locus, i.e., a locus which is along a constant real component that is a reciprocal function of the constant real component seen while capacitor 15 is varied.

Apparatus for automatically controlling the values of capacitors 14 and 15 in accordance with the just previously described method is indicated in FIG. 1, wherein capacitors 14 and 15 are driven by motors 16 and 17. Initially, capacitor 14 is short-circuited by closing switch 18 while capacitor 15 is set to a minimum value so that the susceptance seen by transmitter 11 looking into network 13 is a minimum. Thereafter, the value of capacitor 15 is increased until the impedance magnitude seen by looking from the output terminals of transmitter 11 into network 13 reaches a predetermined value. In response to the predetermined impedance magnitude being reached, motor 17 is stopped and switch 18 is open-circuited. Thereafter, motor 16 drives capacitor 14 so that the capacitance thereof is decreased from a maximum value, where the reactance seen looking from transmitter 11 into network 13 is a minimum. The value of capacitor 14 is decreased until the voltage and current supplied by transmitter 11 to matching network 13 are in phase, at which time further variation of capacitor 14 is terminated and network 13 is matching circuits 11 and 12 to within an acceptable VSWR range.

It is to be understood that capacitors 14 and 15 can be controlled in sequence in response to digital control signals, as well as in response to the output shafts of motors 16 and 17. If digital controls are employed, capacitors 14 and 15 initially have maximum and minimum values which are respectively decreased and increased by progressively decreasing increments. Thereby, capacitor 15 is initially increased by a step that is one-half the total capacitance range of capacitor 15 and a test is made to determine if the impedance magnitude is above or below the predetermined value. In response to the impedance value being below the predetermined magnitude, the value of capacitor 15 is increased by a further step that is one-quarter of the total range of the capacitive value thereof. If, after the second step, the value of capacitor 15 causes the detected impedance magnitude to be greater than the predetermined value, the value of capacitor 15 is decreased by a value that is one-eighth of the total range of values for capacitor 15. In this way, the value of capacitor 15 is varied in progressively decreasing steps until the detected impedance magnitude is equal to the desired or predetermined impedance magnitude. In a similar manner, the capacitance of capacitor 14 is decreased in progressively decreasing steps. Digital control of capacitors 14 and 15 can be achieved with a circuit of the type disclosed in U.S. Pat. No. 3,509,500 to McNair et al.

Circuitry for the sequential, analog control of capacitors 14 and 15 by D.C. motors 16 and 17 is specifically illustrated in FIG. 1. The control circuitry includes a conventional impedance magnitude detector 21 wherein the impedance magnitude seen by looking from transmitter 11 into matching network 13 is detected as a D.C. analog signal that is compared with a predetermined value, as derived from a tap of potentiometer 22. The phase relationship between the voltage supplied by transmitter 11 to network 13 and the current supplied by the transmitter to the matching network is determined by phase detector 23. Detectors 21 and 23 derive bi-level output signals whereby a positive voltage level (binary one level) is derived from detector 21 in response to the detected impedance magnitude exceeding the predetermined impedance magnitude and a zero or negative voltage level (binary zero level) is derived from detector 21 in response to the predetermined impedance exceeding the detected impedance magnitude. In response to the phase of the voltage applied by transmitter 11 to network 13 leading the current supplied by the transmitter to the matching network, phase detector 23 derives a binary one output level, while a binary zero is derived by the phase detector in response to the current leading the voltage.

In normal operation, the values of capacitors 14 and 15 are maintained constant and the automatic controller for matching network 13 is in a dormant state. Automatic matching is initiated in response to the VSWR seen by transmitter 11 being greater than a predetermined value, as detected by VSWR detector 24. Detector 24 is connected between transmitter 11 and matching network 13 to derive a D.C. signal voltage indicative of the VSWR seen from the output terminals of transmitter 11. Detector 24 is responsive to a predetermined voltage derived from potentiometer 25 that is indicative of the maximum acceptable VSWR and compares the signal voltage indicative of the detected VSWR with the voltage of potentiometer 25. In response to the maximum acceptable VSWR being reached or exceeded while the controller is in a dormant state, detector 24 derives a binary one level that activates the automatic matching apparatus; at all other times detector 24 derives a binary zero level.

In response to VSWR detector 24 switching from a binary zero to a binary one level, a waveform having a positive going leading edge is coupled to and detected by a set input terminal of flip-flop 26. Flip-flop 26 is thereby activated to the set state, causing a binary one output to be derived from its principle (Q) output terminal. The binary one level at the Q output terminal of flip-flop 26 is applied to normally closed switch 27 that selectively short circuits attenuator 28 which is connected between the output terminals of transmitter 11 and matching circuit 13. In normal operation, when the matching network 13 is not being adjusted, attenuator 28 is inoperative because switch 27 is closed. During the automatic matching operation, it is necessary to insert attenuator 28 into the circuit to prevent excessive reflections from being coupled from matching network 13 into transmitter 11, with possible deleterious effects on the transmitter and to reduce the input voltage to detector 24 so that one automatic control sequence cannot be initiated until a previously started sequence has been completed. Thereby, during the entire automatic matching sequence, switch 27 is open-circuited in response to the binary one level derived from the Q output terminal of flip-flop 26 and attenuator 28 is effectively connected in series between transmitter 11 and matching network 13.

The leading edge at the Q output of flip-flop 26 also initiates control circuitry for D.C. motors 16 and 17. To this end, the leading edge of the Q output of flip-flop 26 is coupled to the set input terminal of flip-flop 29 and causes flip-flop 29 to be activated from a reset to a set state. In response to flip-flop 29 being in a set state, the principle (Q) output terminal of the flip-flop is driven to a binary one state causing latched switches 31 and 32 to be driven from a normally open state to a closed state. Switches 31 and 32 respectively couple positive D.C. voltages to motors 16 and 17 from D.C. sources 33 and 34. The positive voltages respectively applied by D.C. sources 33 and 34 to motors 16 and 17 drive the motors until capacitors 14 and 15 are respectively driven to their maximum and minimum values. In response to capacitors 14 and 15 being driven to their maximum and minimum values, limit switches 36 and 37 are activated so they derive binary one values that are applied as control voltages to switches 31 and 32, to cause the switches to open circuit. In response to both of switches 36 and 37 deriving binary one levels, AND gate 38 derives a binary one level to indicate that both of capacitors 14 and 15 have been driven to their limits.

The leading edge of the binary one signal derived from AND gate 38 is coupled to the reset input of flip-flop 29, causing that flip-flop to be activated to the reset state, whereby a binary one output is derived from the complementary ($\bar{Q}$) output terminal of flip-flop 29. The leading edge of the $\bar{Q}$ output of flip-flop 29 is coupled to the set input terminal of flip-flop 41, causing flip-flop 41 to be activated from the reset to the set state. In response to flip-flop 41 being activated to the set state, a binary one output is derived from the Q output terminal of the flip-flop and is applied as a control signal to cause normally open-circuited contact 18, which shunts capacitor 14, to close and establish a short circuit across capacitor 14.

Simultaneously with capacitor 14 being effectively removed from the circuit by the closure of contact 18, capacitor 15 is varied so its value increases, a result achieved by coupling the Q output of flip-flop 41 as a control input to switch 43 that connects a positive terminal of D.C. power supply 144 to motor 17. Motor 17 continues to increase the value of capacitor 15 until the impedance magnitude sensed by detector 21 equals the predetermined impedance magnitude indicated by the voltage at the tap of potentiometer 22, at which time a transition in the output of detector 21 occurs. The transition in the output of detector 21 is sensed by differentiator 44 which derives an output pulse that is combined with the binary output of phase detector 23 in AND gate 45 that is also responsive to the binary level at the Q output terminal of flip-flop 41. In response to the sensed impedance magnitude being equal to the predetermined value while the detected phase relationship indicates that the voltage applied to matching network 13 leads the current applied by transmitter 11 to the matching network while flip-flop 41 is in a set state, a binary one output is derived from AND gate 45. The leading edge of the binary one output of AND gate 45 is coupled to and activates the reset input of flip-flop 41, causing flip-flop 41 to be activated to the reset state.

In response to flip-flop 41 being driven to a reset state, a binary zero level is derived at the Q output of the flip-flop, causing switches 18 and 43 to be simultaneously open-circuited. In response to switch 43 open-circuiting, motor 17 stops and the value of capacitor 15 is set at the value which caused a binary one output to be derived from AND gate 45. Open-circuiting switch 18 causes capacitor 14 to be effectively switched into the network; because the capacitor has a maximum value, there is not an appreciable change between the impedance seen by looking from the output terminals of transmitter 11 into network 13 relative to the impedance which was seen while capacitor 14 was open-circuited immediately prior to open-circuiting of switch 18. In response to flip-flop 41 being activated to the reset state, a leading edge transition is coupled to the set input of flip-flop 46, causing flip-flop 46 to be activated to the set state. With flip-flop 46 in a set state, a binary one output is derived from the Q output terminal of the flip-flop. The binary one level derived from the Q output of flip-flop is applied as a control signal to normally open-circuited switch 47. Switch 47 is closed in response to the binary one output of flip-flop 46, thereby connecting the negative terminal of D.C. source 48 to motor 16, whereby the motor drives capacitor 14 so that the value of capacitor 14 decreases. Motor 16 continues to drive capacitor 14 until a transition occurs in the output of phase detector 23, at which time the voltage and current applied by transmitter 11 to matching network 13 are in phase.

In response to a transition at the output of phase detector 23, as occurs when there is a change in the relative polarity of the voltage and current sampled by the detector, a pulse is derived by differentiator 51. The output pulse of differentiator 51 is combined in AND gate 52 with the Q output level of flip-flop 46 and the resultant pulse at the output of gate 52 is coupled to the reset input of flip-flop 46. In response to the pulse applied to the reset input terminal of flip-flop 46, the flip-flop is activated to the reset state causing the binary one level to be removed from the Q output terminal of the flip-flop, causing switch 47 to be activated to the open circuit condition. In response to switch 47 being in the open circuit condition, drive for motor 16 is terminated whereby the value of capacitor 14 is maintained at the value which caused a zero phase to be detected by detector 23. Resetting of flip-flop 46 also causes a binary one level to be derived at the $\bar{Q}$ of the flip-flop. The leading edge of the $\bar{Q}$ output of flip-flop 46 is coupled to the reset input terminal of flip-flop 26, causing flip-flop 26 to be activated to the reset state.

In response to flip-flop 26 being activated to the reset state, a binary zero level is derived from the Q output terminal of the flip-flop, causing switch 27 to be returned to its normally closed condition so that attenuator 28 is removed from the circuit. The automatic operating sequence has now been completed and is not initiated again until the VSWR sensed by detector 24 exceeds the predetermined value indicated by the setting of potentiometer 25.

The automatic matching method of the present invention is also applicable to other matching networks, as illustrated by FIGS. 2–4. It is to be understood that apparatus for automatically controlling the networks of FIGS. 2-4 similar to that described for FIG. 1 can be provided and that this control apparatus functions to perform the methods described infra.

FIG. 2 incorporates a matching network 61 having a series, variable capacitor 62 and a shunt, variable capacitor 63, in parallel with the output terminals of transmitter 11. High-Q load 12 is of the same type as illustrated in FIG. 1 and thereby includes a relatively large inductive reactance and relatively small resistance.

In the matching network of FIG. 2, shunt capacitor 63 is initially effectively removed from the network by open-circuiting a switch (not shown) in the branch including capacitor 63. Initially, the values of capacitors 62 and 63 are respectively set at maximum and minimum values. With capacitor 63 removed from the network, the value of series capacitor 62 is decreased resulting in an increase in the reactance and impedance seen by looking from the output terminals of transmitter 11 into matching network 61 but no change in the resistance seen at the transmitter output terminals. The impedance at the transmitter output thereby moves along a line of constant resistance until the impedance magnitude seen at the output terminals of the transmitter 11 decreases to a predetermined value. In response to the impedance magnitude reaching the predetermined value, the relative phase between the voltage and current applied by transmitter 11 to matching network 61 is detected. If the phase of the voltage leads the phase of the current, an indication is provided that no further variation in the value of capacitor 62 should be made. Then, shunt capacitor 63 is connected into the circuit by closing the switch in series with the capacitor. Thereafter, the value of capacitor 63 is increased to increase the susceptance and admittance seen by looking from transmitter 11 into network 61 while the seen conductance remains constant. The value of capacitor 63 is increased until the voltage and current applied by transmitter 11 to matching network 61 have the same phase, at which time matching to within the predetermined range is achieved.

If it is expected that the load is primarily capacitive, rather than inductive, as indicated by load circuit 70, FIG. 3, a matching network 71 including variable inductances 72 and 73 is employed. Matching network 71 is the inductive dual of capacitive matching network 13 since it includes a series inductor 72, connected between transmitter 11 and load 70, as well as a shunt inductor 73 that is in parallel with capacitive load 70. Inductor 72 is initially removed from the circuit by a short-circuiting switch (not shown but similar to switch 18, FIG. 1). For automatic matching, inductor 73 is set at its maximum value. Thereby, minimum susceptance and admittance are initially seen by looking into matching network 71 from transmitter 11; these are the same effects as those provided by the matching network of FIG. 1 during initial conditions. Thereafter, the value of inductor 73 is decreased, causing increases in the suceptance and admittance seen by looking from transmitter 11 into network 71 without changing the conductance seen from the output terminals of transmitter 11. The value of inductor 73 is decreased until the impedance magnitude seen by looking from transmitter 11 into matching network 71 is equal to a predetermined value. In response to the predetermined impedance magnitude being sensed, the polarity of phase between the voltage and current supplied by transmitter 11 to matching network 71 is sensed. In response to the voltage applied by transmitter 11 lagging the current applied by the transmitter to the matching network, no further changes are made in the value of inductor 73 and inductor 72 is effectively connected in the network by removing the short circuit across it. When inductor 72 is initially connected to the network, the inductor has a minimum value. After the short circuit is removed from inductor 72, the value of the inductor is increased until the voltage and current applied by transmitter 11 are in phase, at which time further variation of inductor 72 is terminated.

An alternate matching network for connecting transmitter 11 to capacitive load 70 is illustrated in FIG. 4. In FIG. 4, the matching circuit 74 includes a variable, shunt inductor 75 connected in parallel with the output terminals of transmitter 11, as well as a series, variable inductor 76 that is connected between the transmitter output terminals and load 70. Hence, the matching network of FIG. 4 is the inductive dual of the capacitive matching network of FIG. 2.

Inductor 75 is initially removed from the circuit by open-circuiting a switch (not shown) connected in the branch including inductor 75; the value of inductor 76 is set to a minimum value. The value of inductor 76 is thereafter increased until the impedance magnitude seen by looking from the output terminals of transmitter 11 into matching network 74 reaches a predetermined value. In response to the predetermined impedance magnitude being reached, a check is made of the phase relationship of the voltage and current applied by transmitter 11 to matching network 74. In response to the phase of the voltage lagging the phase of the current, an indication is provided that the correct value for inductor 76 has been reached and no further changes in the value of inductor 76 are made. If the phase of the voltage leads the phase of the current, inductor 76 is varied until the predetermined impedance magnitude is again detected, at which time the phase of the voltage and current applied by transmitter 11 to matching network 74 is again sensed. In response to the voltage lagging the current while the predetermined impedance is being sensed, an indication is derived that no further changes in the magnitude of inductor 76 are to be made and the value of the inductor is not altered. Then, inductor 75 is connected in circuit by closing the switch connected in series with it. When inductor 75 is first connected to the network, it has a maximum value. The value of the inductor 75 is decreased until the voltage and current applied by transmitter to matching network 74 are in phase, at which time no further changes are made in the value of inductor 75 and the transmitter and load can be considered as matched within the predetermined VSWR range.

Figure 5:
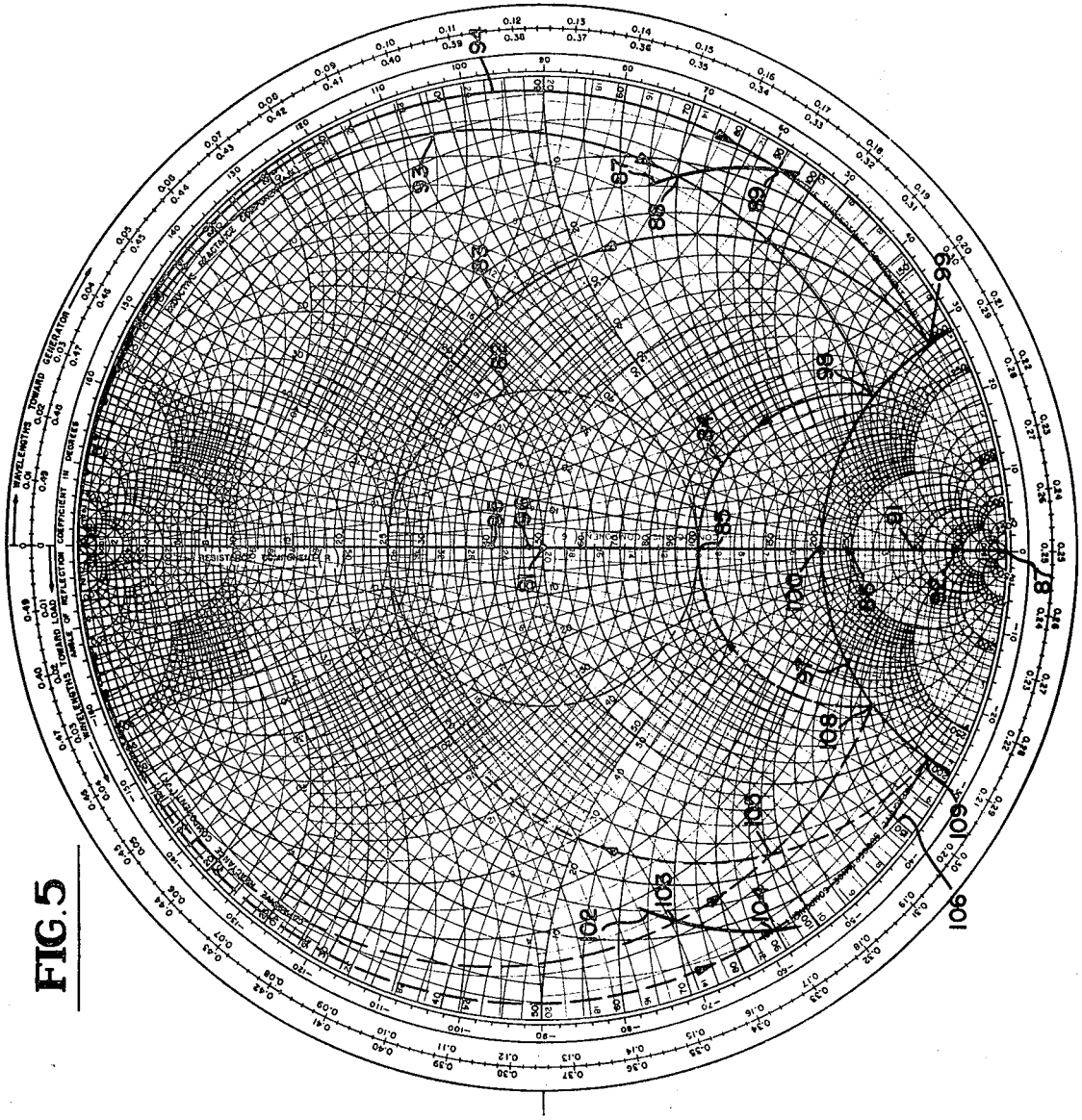
FIG. 5 is a Smith chart indicating the manner in which the matching networks of FIGS. 1 and 3 function.
Figure 6:
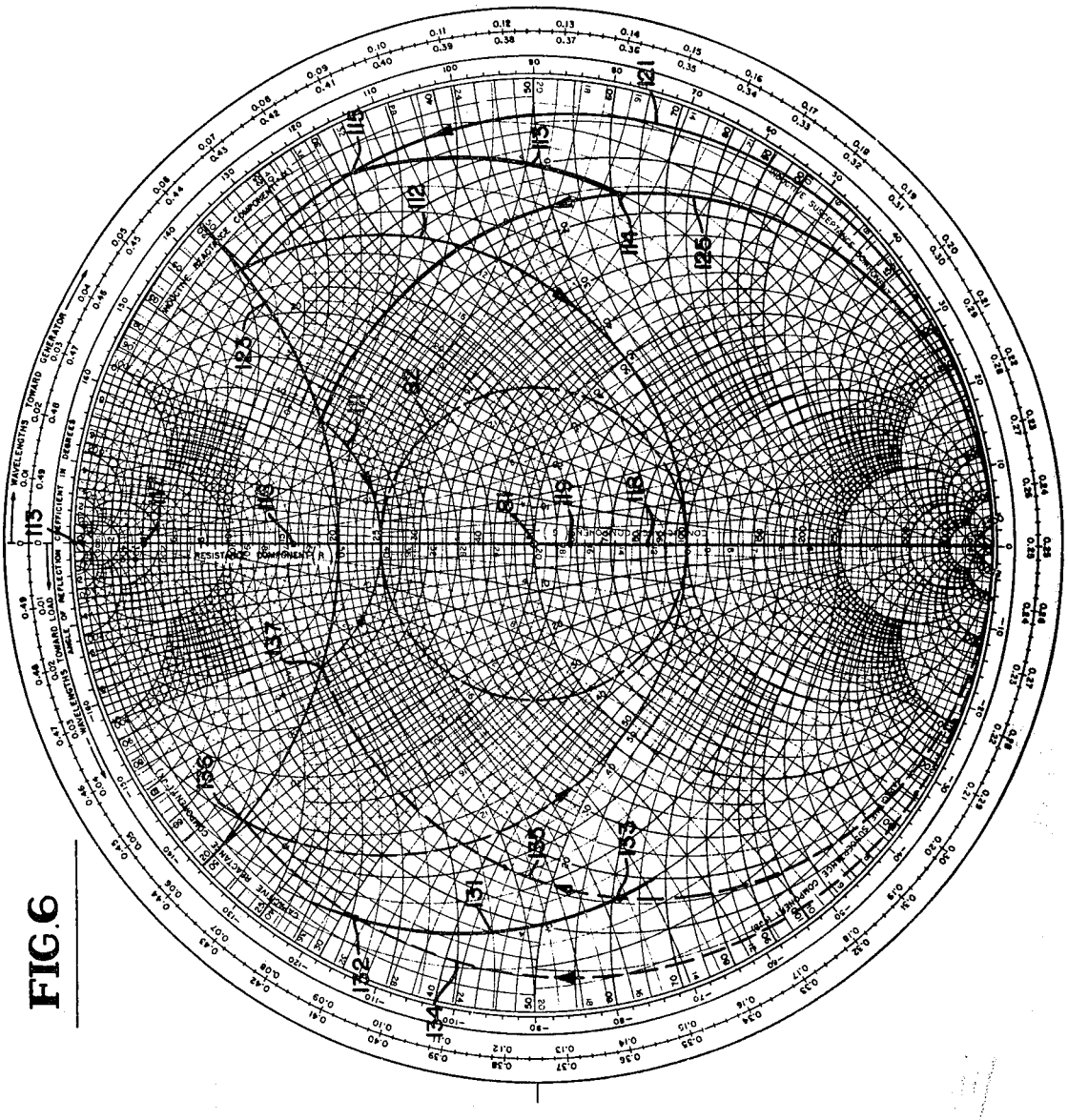
FIG. 6 is a Smith chart indicating the manner in which the matching networks of FIGS. 2 and 4 function.

To further describe the manner in which the matching networks of FIGS. 1–4 function and to assist in establishing the criteria for selection of the predetermined impedance values, reference is now made to the Smith charts of FIGS. 5 and 6. On the right and left sides of FIG. 5 are respectively illustrated impedance trajectories for the matching networks of FIGS. 1 and 3; in FIG. 6 impedance trajectories for the matching networks of FIGS. 2 and 4 are respectively illustrated on the right and left sides. For all four matching networks, it is assumed that the output impedance of transmitter 11, and therefore the impedance which is desired to be matched to the transmitter output terminals, is 50 ohms and that the maximum permissible standing wave ratio is 2:1. Therefore, the center 81 of each of the Smith charts of FIGS. 5 and 6 is 50 ohms and constant VSWR circles 82 are established with their centers at point 81. The radii of circles 82 extend along the vertical axes of the charts from 50 ohms to 25 ohms and from 50 ohms to 100 ohms. For larger and smaller maximum VSWR ranges, the radii of circles 82 are respectively increased and decreased; e.g., for a maximum VSWR of 4:1, the radii of the constant VSWR circles extend along the vertical axis of the Smith charts from 50 to 200 ohms and from 50 to 12.5 ohms.

From the highest and lowest peripheral points of the constant VSWR circle 82 of FIG. 5 are respectively drawn the peripheries of constant resistance circles 83 and 84 which define contours or loci at the limits of the maximum VSWR range. Circles 83 and 84 respectively have centers 85 and 86 that lie along the vertical axis of the Smith chart and are equidistant from bottom point 87 at the Smith chart to the highest and lowest peripheral points of circle 82. In the example of FIGS. 5 and 6, wherein the VSWR maximum circle = 2, point 85 is coincident with the bottom point of circle 82. For other values of the VSWR circle, coincidence does not exist between the center of circle 83 and the lower peripheral point of circle 82.

It is assumed that load 12 of FIG. 1 has an impedance, as a function of frequency, represented by curve 87, on the right side of the Smith chart of FIG. 5. At the lowest and highest frequencies in the frequency range over which load 12 is driven by transmitter 11, the impedance of the load is respectively represented by points 88 and 89 on curve 87; at points 88 and 89, the conductances of load 12 are respectively maximum and minimum. The conductance values at points 88 and 89 are projected onto the vertical axis of the Smith chart, to points 91 and 92, to enable a pair of constant conductance circles 93 and 94 having centers 95 and 96 along the vertical axis of the Smith chart to be drawn; the periphery of circle 93 intersects points 88 and 91, while the periphery of circle 94 intersects points 89 and 92. The intersection points 98 and 99 between circles 93 and 84 and circles 94 and 83 are along constant impedance magnitude circle 97. The center of circle 97 is below the Smith chart but lies along an extension of the vertical axis of the Smith chart. Since two points on the periphery of circle 97 are known, at intersection points 98 and 99, and it is known that the center of circle 97 lies along the vertical axis of the Smith chart, the center of the circle 97 can be determined from geometric principles.

After having determined the center of circle 97, the impedance magnitude associated with the circle is obtained by reading the resistance value from the intersection point of circle 97 with the vertical axis of the Smith chart. The impedance magnitude of circle 97 establishes the predetermined impedance value that is compared with the impedance value sensed by detector 21 to control the value of capacitor 15 in FIG. 1. The value of capacitor 15 is adjusted until the impedance sensed by detector 21 reaches the value at circle 97, which will be at a point along the perimeter of the circle between points 98 and 99; the location of the point depends on the excitation frequency for load 12. Because capacitor 14 is initially short circuited, the impedance seen by looking from transmitter 11 into matching circuit 13 moves along a constant conductance circle as capacitor 15 is varied. The constant conductance circle along which the conductance seen by looking from transmitter 11 into matching network 13 has a point on curve 87, between points 88 and 89, depending upon the excitation frequency of load 12 by transmitter 11. At the two frequency extremes, the conductance seen by looking from transmitter 11 into matching network 13 moves along the perimeters of constant conductance circles 93 and 94.

In response to the impedance sensed by detector 21 reaching the value associated with circle 97, a test is made to determine if the phase of the voltage leads the phase of the current supplied by transmitter 11 to load 12 by sensing the output level of phase detector 23. If the voltage leads the current, as indicated by the right portion of the Smith chart, capacitor 14 is effectively connected in the circuit and is varied. As capacitor 14 is varied the resistance seen looking from transmitter 11 into matching network 13 varies along a constant resistance circle dependent upon the load excitation frequency; the extremities of the perimeters of the constant resistance circles are from the perimeters of circles 83 and 84, inclusive. When phase detector 23 and differentiator 51 sense that the voltage and current supplied by transmitter 11 to matching network 13 are in phase, (at the vertical axis of the Smith chart), further variations in the value of capacitor 14 are terminated.

A similar situation exists for the load and matching network of FIG. 3. It is assumed that the load of FIG. 3 is the capacitive dual of the load of FIG. 1 and that the load is excited over the same frequency band as the load of FIG. 1. Thereby, the locus of the impedance of load 70 for the matching network of FIG. 3 is along a curve 102 (FIG. 5) on which lie points 103 and 104 at the upper and lower frequency extremes for the load excitation. Maximum and minimum conductance circles 105 and 106 respectively intersect points 103 and 104 and points 107 and 108 on a predetermined impedance magnitude circle. Because the load of FIG. 3 is the dual of the load of FIG. 1, the predetermined impedance circle associated with FIG. 3 is coincident with the predetermined impedance circle 97 associated with FIG. 1. It is thereby noted that points 108 and 109 respectively intersect circles 84 and 83.

The impedance magnitude associated with predetermined impedance circle 97 is not equal to the desired final impedance seen by looking from terminal 11 into network 13 under a matched condition. Also, the resistance seen by looking from transmitter 11 into matching network 13 does not necessarily coincide with the constant resistance circle that intersects center 81 of the Smith chart. In fact, there is only one excitation frequency for load 12 which results in coincidence between the constant resistance circle that intersects point 81 and predetermined impedance circle 97.

For the networks of FIGS. 1 and 3, it can be shown that constant impedance circle 97 has a magnitude that is a function of known output impedance of transmitter 11, $Z_o$, the maximum VSWR, $\sigma_m$, and the maximum conductance of the load or the minimum load conductance at the two frequency extremes. The value of the predetermined impedance is given by:

$$|Z| = [\frac{\sigma_m Z_o}{G_{max}}]^{1/2} = [\frac{Z_o}{\sigma_m G_{min}}]^{1/2} \quad (7)$$

For the situation illustrated by the Smith chart of FIG. 5, $Z_o = 50$ ohms, $\sigma_m = 2$, $G_{max}$ = the conductance associated with point 88 and $G_{min}$ = the conductance associated with point 89.

Equation (7) is derived as follows: The conductances at points 98 and 99, along constant conductance circles 93 and 94, are equal to the load conductances at the two frequency extremes and are thereby given by:

$$G_T = G_{max} = \frac{R_T}{R_T^2 + X_T^2} \quad (8)$$

and $$G_S = G_{min} = \frac{R_s}{R_s^2 + X_s^2} \quad (9)$$

where:
$R_T$ = the resistance of load 12 at the frequency corresponding with point 88,
$X_T$ = the reactance of load 12 at the frequency corresponding with point 88, $R_s =$ the resistance of load 12 at the frequency corresponding with point 89, and $X_s =$ the reactance of load 12 at the frequency corresponding with point 89.

The impedance magnitudes at point 98 and 99 are equal to each other and are thereby given by:

$$|Z|^2 = R_T^2 + X_T^2 = R_s^2 + X_s^2 \qquad 10.$$

Since constant resistance circles 83 and 84 have contours defined by:

$$R_T = \sigma_m Z_o \qquad 11.$$

and $$R_s = Z_o/\sigma_m \qquad 12.$$

Substitution of Equations (11) and (12) into Equation (10) yields:

$$X_T^2 = |Z|^2 - \sigma_m^2 Z_o^2 \qquad 13.$$

and $$X_s^2 = |Z|^2 - (Z_o/\sigma_m) \qquad 14.$$

Combining Equations (8), (9), (13), and (14) yields:

$$G_{max} = \sigma_m \frac{Z_o}{|Z|^2} \qquad (15)$$

and $$G_{min} = \frac{1}{\sigma_m} \times \frac{Z_o}{|Z|^2} \qquad (16)$$

By combining Equations (15) and (16), it is seen that the ratio of the maximum to minimum load conductance which can be matched within the predetermined VSWR is simply:

$$(G_{max}/G_{min}) = \sigma_m^2 \qquad 17.$$

Solving Equations (15) and (16) for the magnitude of the predetermined impedance (i.e., the magnitude associated with constant impedance circle 97) yields:

$$|Z| = [\frac{\sigma_m Z_o}{G_{max}}]^{1/2} = [\frac{Z_o}{\sigma_m G_{min}}]^{1/2} \qquad (18)$$

Hence, capacitor 15 is varied until the sensed impedance magnitude differs from the output impedance of transmitter 11 by a factor that is related to the conductance of the impedance of load 12. The analysis for the circuit of FIG. 3 is identical to that of FIG. 1 and Equation (18) is applicable.

For the configurations of FIGS. 2 and 4, the Smith chart analyses are respectively indicated by the right and left sides of FIG. 6. Again, a constant VSWR circle 82 having its center 81 at the center of the Smith chart is drawn with a radius dependent upon the acceptable VSWR range. From the upper and lower peripheral points of circle 82 are drawn constant conductance circles 111 and 112 which intersect point 113 at the upper peripheral point of the Smith chart, along the vertical axis of the chart.

For the inductive load 12 of FIG. 2, it is assumed that the load impedance varies along curve 113 as the excitation frequency of the load varies; thereby at the maximum and minimum excitation frequencies of the load, curve 113 is respectively coincident with points 114 and 115. Points 114 and 115 represent the maximum and minimum resistances seen by looking into load 12 at the maximum and minimum excitation frequencies of the load by transmitter 11. The minimum and maximum resistances of the load at the frequency extremes are respectively projected onto the vertical axis of the Smith chart, at points 116 and 117 to enable the centers 118 and 119 of constant resistance circles 120 and 121 to be established along the vertical axis of the Smith chart. The intersection points of circles 121 and 112 and circles 120 and 111 define a predetermined, constant impedance magnitude circle 123 which establishes the criterion for setting the value of capacitor 62.

Utilizing an analysis similar to that described above for FIG. 5, it can be shown that the impedance magnitude associated with circle 123 is represented by:

$$|Z| = [\sigma_m Z_o R_{min}]^{1/2} = [\frac{Z_o R_{max}}{\sigma_m}]^{1/2} \qquad (19)$$

where:

$\sigma_m$ and $Z_o$ are given supra, $R_{min} =$ the resistive value of load 12 at the frequency corresponding with point 15 and $R_{max} =$ the resistive value of impedance 12 at the frequency corresponding with point 114.

In operation, anywhere in the frequency range between the frequencies corresponding with points 114 and 115, capacitor 63 is initially removed from the circuit and capacitor 62 is varied, causing the resistive impedance seen by looking from transmitter 11 into matching network 61 to move along a constant resistance circle between and including circles 120 and 121, depending upon the excitation frequency of the load. Capacitor 62 is varied until the predetermined impedance indicated by circle 123 is reached, at which time a test is made to determine if the voltage applied by transmitter 11 to the matching network leads the current applied by the transmitter to the matching network. In response to the voltage leading the current, capacitor 63 is connected in the circuit and is varied so that a constant conductance circle is described between constant impedance circle 123 and the vertical axis of the Smith chart, at which time the phase of the voltage and current applied by transmitter 11 to the matching network goes through zero. In response to the phase of the voltage and current applied by transmitter 11 to matching network 61 being zero, further variation of capacitor 63 is terminated and the network is matched at some VSWR value equal to or less than the value associated with circle 82. Utilizing an analysis similar to that described in connection with FIG. 5, it can be shown that the ratio of maximum to minimum load resistance which can be matched within a given maximum VSWR range is:

$$(R_{max}/R_{min}) = \sigma_m^2 \qquad 20.$$

If the load 70 associated with the matching circuit of FIG. 4 is the capacitive dual of the inductive load of FIG. 2, a locus of the impedance values over an excitation frequency range is given by curve 131 on the left side of the Smith chart of FIG. 6. At the lower and upper frequency extremes, curve 131 is respectively coincident with points 132 and 133. Points 132 and 133 lie along constant resistance circles 134 and 135, respectively, which have their centers at points 118 and 119. Hence, circles 134 and 135 are coincident with circles 120 and 121, the expected result since the load of FIG. 4 is the dual of the load of FIG. 2. Constant resistance circles 134 and 135 respectively intersect constant impedance magnitude circle 123 at points 136 and 137, which also are coincident with constant conductance circles 112 and 111, respectively.

In operation, inductor 75 is removed from the circuit and inductor 76 is varied so that the resistance seen by transmitter 11 while looking toward matching network 74 moves along a constant resistance line anywhere in the region from constant resistance lines 134 and 135. In response to the sensed impedance being equal to the impedance associated with circle 123, a test is made to determine if the phase of the voltage applied by transmitter 11 to matching network 74 lags the phase of the current applied by the transmitter to the matching network. If the voltage lags the current, inductor 75 is switched into the circuit and varied so that a constant conductance circle is described until the vertical axis of the Smith chart is reached when the voltage and current applied by transmitter 11 to matching network 11 are in phase.

While there have been described and illustrated several specific embodiments of the invention, it will be clear that variations in the details of the embodiments specifically illustrated and described may be made without departing from the true spirit and scope of the invention as defined in the appended claims. For example, the invention is applicable to situations wherein an antenna is an excitation source for driving a load.

What is claimed is:

1. A method of matching a load circuit to a drive circuit with a matching network connected between the circuits, one of said circuits having a relatively high Q so that a real impedance component detector for the one circuit is incapable of accurately determining the real component because the real component is much less than an imaginary component of the circuit being matched, said matching network including a series reactance and a shunt reactance, comprising: varying the value of one of the reactances until a detected impedance magnitude as seen from the drive circuit reaches a predetermined value regardless of the magnitude of the phase angle between the voltage and current supplied by the drive circuit to the load circuit when the predetermined impedance value is detected, said reactances being connected and of a type so that as the one reactance is being varied a real component as seen from the drive circuit has a constant value during the variation of the one reactance; in response to the detected impedance magnitude reaching the predetermined value, varying the value of the other reactance until the phase angle between the voltage and current supplied by the drive circuit to the matching network has a predetermined relationship, said reactances being connected and of a type so that as the other reactance is being varied the inverse real component seen from the drive circuit has a constant value during the variation of the other reactance.

2. The method of claim 1 wherein the predetermined value of the impedance magnitude differs from the output impedance of the drive circuit, but is dependent upon the output impedance of the drive circuit and a real component of the load.

3. The method of claim 1 wherein the matching circuit is an L network wherein the series and shunt reactances are of the same type, the load having a reactance of one type and the reactances of the matching network being the other type, the shunt reactance being connected across the drive circuit and the series reactance being connected between the shunt reactance and the load circuit, wherein the series reactance is varied until the impedance magnitude reaches the predetermined value and the shunt reactance is varied until the phase angle has the predetermined relationship, and the shunt reactance is varied only in response to the voltage supplied to the load circuit by the drive circuit leading the current supplied to the load by the drive circuit.

4. The method of claim 1 wherein the matching circuit is an L network wherein the series and shunt reactances are of the same type, the load having a reactance of one type and the reactances of the matching network being the other type, the shunt reactance being connected across the load circuit and the series reactance being connected between the shunt reactance and the drive circuit, wherein the shunt reactance is varied until the impedance magnitude reaches the predetermined value and the series reactance is varied until the phase angle has the predetermined relationship, and the series reactance is varied only in response to the voltage supplied to the load circuit by the drive circuit lagging the current supplied to the load by the drive circuit.

5. The method of claim 1 wherein the network includes a first arm including the one reactance connected in parallel with the load and a second arm including the other reactance connected in series between the circuits, whereby the real and inverse real components are respectively the conductance and resistance components, said network matching the circuits over a range of frequencies with a voltage standing wave ratio no greater than a predetermined value, $\sigma_m$, and wherein the predetermined magnitude of the impedance is:

$$|Z| = [\frac{\sigma_m Z_o}{G_{max}}]^{1/2} = [\frac{Z_o}{\sigma_m G_{min}}]^{1/2}$$

where:

$Z_o$ = the output impedance of the drive circuit, $G_{max}$ = the conductance of the load for one of the frequency extremes in the range, and $G_{min}$ = the conductance of the load for the other frequency extreme in the range.

6. The method of claim 5 further including the step of detecting the voltage standing wave ratio seen by looking from the drive circuit into the matching network, and in response to the detected voltage standing wave ratio exceeding $\sigma_m$ performing the steps defined by claim 1.

7. The method of claim 5 further including the step of determining the polarity of the phase relationship between the voltage and current supplied by the drive circuit to the network when the impedance magnitude seen from the drive circuit reaches the predetermined value, and performing the step of varying the value of the other reactance only in response to the polarity of the phase having a predetermined value while the impedance magnitude has the predetermined value.

8. The method of claim 7 wherein the series and shunt reactances are capacitive and the predetermined phase polarity is such that the voltage supplied by the drive circuit leads the current supplied by the drive circuit.

9. The method of claim 7 wherein the series and shunt reactances are inductive and the predetermined polarity is such that the voltage supplied by the drive circuit lags the current supplied by the drive circuit.

10. The method of claim 1 wherein the network includes a first arm including the one reactance connected in series between the circuits and a second arm including the other reactance connected in parallel with output terminals of the drive circuit, whereby the real and inverse real components are respectively the resistance and conductance components, said network matching the circuits over a range of frequencies with a voltage standing wave ratio no greater than a predetermined value, $\sigma_m$, and wherein the predetermined magnitude of the impedance is:

$$|Z| = [\sigma_m Z_o R_{min}]^{1/2} = \left[\frac{Z_o R_{max}}{\sigma_m}\right]^{1/2}$$

where:
$Z_o$ = the output impedance of the drive circuit,
$R_{max}$ = the resistance of the load for one of the frequency extremes in the range, and
$R_{min}$ = the resistance of the load for the other frequency extreme in the range.

11. The method of claim 10 further including the step of detecting the voltage standing wave ratio seen by looking from the drive circuit into the matching network, and in response to the detected voltage standing wave ratio exceeding $\sigma_m$ performing the steps defined by claim 1.

12. The method of claim 10 further including the step of determining the polarity of the phase relationship between the voltage and current supplied by the drive circuit to the network when the impedance magnitude seen from the drive circuit reaches the predetermined value, and performing the step of varying the value of the other reactance only in response to the polarity of the phase having a predetermined value while the impedance magnitude has the predetermined value.

13. The method of claim 12 wherein the series and shunt reactances are capacitive and the predetermined phase polarity is such that the voltage supplied by the drive circuit leads the current supplied by the drive circuit.

14. The method of claim 12 wherein the series and shunt reactances are inductive and the predetermined polarity is such that the voltage supplied by the drive circuit lags the current supplied by the drive circuit.

15. The method of claim 1 further including the step of determining the polarity of the phase relationship between the voltage and current supplied by the drive circuit to the network when the impedance magnitude seen from the drive circuit reaches the predetermined value, and performing the step of varying the value of the other reactance only in response to the polarity of the phase having a predetermined value while the impedance magnitude has the predetermined value.

16. The method of claim 15 wherein the series and shunt reactances are capacitive and the predetermined phase polarity is such that the voltage supplied by the drive circuit leads the current supplied by the drive circuit.

17. The method of claim 15 wherein the series and shunt reactances are inductive and the predetermined polarity is such that the voltage suppled by the drive circuit lags the current supplied by the drive circuit.

18. The method of claim 1 wherein the predetermined impedance differs from the output impedance of the drive circuit but is dependent upon the maximum tolerable value of a standing wave ratio between the load and drive circuit.

19. The method of claim 18 wherein the predetermined impedance value is also determined by the output impedance magnitude of the drive circuit and a real component of the load impedance.

20. A method of matching a load circuit to a drive circuit with a matching network connected between the circuits, one of said circuits having a relatively high Q so that a real impedance component detector for the one circuit is incapable of accurately determining the real component because the real component is much less than an imaginary component of the circuit being matched, said matching network including a series reactance and a shunt reactance, both of said reactances being of the same type, comprising varying the value of one of the reactances while the other reactance is effectively removed from the network until a detected impedance magnitude as seen from the drive circuit reaches a predetermined value regardless of the magnitude of the phase angle between the voltage and current supplied by the drive circuit to the load circuit when the predetermined impedance value is detected; when the impedance magnitude seen from the drive circuit reaches said predetermined value, (a) maintaining the value of the one reactance at the value it had when the predetermined impedance magnitude value was reached, (b) connecting the other reactance to the network, and (c) then varying the value of the other reactance until the phase angle between the voltage and current supplied by the drive circuit to the matching network has a predetermined relationship.

21. The method of claim 20 wherein the predetermined value of the impedance magnitude differs from the output impedance of the drive circuit, but is dependent upon the output impedance of the drive circuit and the real component of the load.

22. The method of claim 20 wherein the network includes a first arm including the one reactance connected in parallel with the load and a second arm including the other reactance connected in series between the circuits, whereby the real and inverse real components are respectively the conductance and resistance components, said network matching the circuits over a range of frequencies with a voltage standing wave ratio no greater than a predetermined value, $\sigma_m$, and wherein the predetermined magnitude of the impedance is:

$$|Z| = \left[\frac{\sigma_m Z_o}{G_{max}}\right]^{1/2} = \left[\frac{Z_o}{\sigma_m G_{min}}\right]^{1/2}$$

where:
$Z_o$ = the output impedance of the drive circuit,
$G_{max}$ = the conductance of the load for one of the frequency extremes in the range, and
$G_{min}$ = the conductance of the load for the other frequency extreme in the range.

23. The method of claim 22 further including the step of determining the polarity of the phase relationship between the voltage and current supplied by the drive circuit to the network when the impedance magnitude as seen from the drive circuit reaches the predetermined value, and performing the step of varying the value of the other reactance only in response to the polarity of the phase having the predetermined value while the impedance magnitude has the predetermined value.

24. The method of claim 23 wherein the series and shunt reactances are capacitive and the predetermined phase polarity is such that the voltage supplied by the drive circuit leads the current supplied by the drive circuit.

25. The method of claim 23 wherein the series and shunt reactances are inductive and the predetermined polarity is such that the voltage supplied by the drive circuit lags the current supplied by the drive circuit.

26. The method of claim 20 wherein the network includes a first arm including the one reactance connected in series between the circuits and a second arm including the other reactance connected in parallel with the drive circuit output terminals, whereby the real and inverse real components are respectively the resistance and conductance components, said network matching the circuits over a range of frequencies with a voltage standing wave ratio no greater than a predetermined value, $\sigma_m$, and wherein the predetermined magnitude of the impedance is:

$$|Z| = [\sigma_m Z_o R_{min}]^{1/2} = \left[\frac{Z_o R_{max}}{\sigma_m}\right]^{1/2}$$

where:

$Z_o$ = the output impedance of the drive circuit, $R_{max}$ = the resistance of the load for one of the frequency extremes in the range, and $R_{min}$ = the resistance of the load for the other frequency extreme in the range.

27. The method of claim 26 further including the step of determining the polarity of the phase relationship between the voltage and current supplied by the drive circuit to the network when the impedance magnitude as seen from the drive circuit reaches the predetermined value, and performing the step of varying the value of the other reactance only in response to the polarity of the phase having the predetermined value while the impedance magnitude has the predetermined value.

28. The method of claim 27 wherein the series and shunt reactances are capacitive and the predetermined phase polarity is such that the voltage supplied by the drive circuit leads the current supplied by the drive circuit.

29. The method of claim 27 wherein the series and shunt reactances are inductive and the predetermined polarity is such that the voltage supplied by the drive circuit lags the current supplied by the drive circuit.

30. The method of claim 20 further including the step of determining the polarity of the phase relationship between the voltage and current supplied by the drive circuit to the network when the impedance magnitude as seen from the drive circuit reaches the predetermined value, and performing the step of varying the value of the other reactance only in response to the polarity of the phase having the predetermined value while the impedance magnitude has the predetermined value.

31. The method of claim 30 wherein the series and shunt reactances are capacitive and the predetermined phase polarity is such that the voltage supplied by the drive circuit leads the current supplied by the drive circuit.

32. The method of claim 30 wherein the series and shunt reactances are inductive and the predetermined polarity is such that the voltage supplied by the drive circuit lags the current supplied by the drive circuit.

33. Apparatus for automatically matching a load circuit to a drive circuit, one of said circuits having a relatively high Q so that a real impedance component detector for the one circuit is incapable of accurately determining the real component because the real component is much less than an imaginary component of the circuit being matched, comprising a matching network connected between the circuits, said matching network including a series reactance and a shunt reactance, means for varying the value of one of the reactances so that a real component as seen from the drive circuit remains constant while the one reactance is varied, means for sensing the impedance magnitude seen from the drive circuit while the one reactance is varied, means responsive to the sensed impedance magnitude reaching a predetermined value and unresponsive to the magnitude of the phase angle between the voltage and current supplied by the drive circuit to the matching circuit for maintaining the value of the one reactance constant and for varying the value of the other reactance so that the inverse real component seen from the drive circuit remains constant while the other reactance is varied, means for sensing the phase angle between the voltage and current supplied by the drive circuit to the matching network while the other reactance is varied, and means responsive to the sensed phase angle having a predetermined magnitude for maintaining the value of the other reactance constant.

34. The apparatus of claim 33 further including means responsive to the impedance magnitude seen from the drive circuit reaching the predetermined value for determining the polarity of the phase relationship between the voltage and current supplied by the drive circuit to the network, and means for activating the means for varying the value of the other reactance only in response to the polarity of the phase having the predetermined value while the impedance magnitude has the predetermined value.

35. Apparatus for automatically matching a load circuit to a drive circuit, one of said circuits having a relatively high Q so that a real impedance component detector for the load circuit is incapable of accurately determining the real component because the real component is much less than an imaginary component of the circuit being matched, comprising a matching network connected between the circuits, said matching network including a series reactance and a shunt reactance, both of said reactances being of the same type, means for varying the value of one of the reactances, means for effectively removing the other reactance from the network while the one reactance is being varied, means for sensing the impedance magnitude seen from the drive circuit while the other reactance is removed, means responsive to the sensed impedance magnitude reaching a predetermined value and unresponsive to the magnitude of the phase angle between the voltage and current supplied by the drive circuit to the matching circuit for: (a) maintaining the value of the one reactance at the value it had when the predetermined impedance magnitude value was reached, (b) connecting the other reactance to the network, and (c) varying the value of the other reactance, means for sensing the phase angle between the voltage and current supplied by the drive circuit to the matching network while the other reactance is being varied, means responsive to the sensed phase angle having a predetermined relationship for maintaining the value of the other reactance at the value it had when the predetermined phase relationship was reached.

36. The apparatus of claim 35 further including means responsive to the impedance magnitude seen from the drive circuit reaching the predetermined value for determining the polarity of the phase relationship between the voltage and current supplied by the drive circuit to the network, and means for activating the means for varying the value of the other reactance only in response to the polarity of the phase having the predetermined value while the impedance magnitude has the predetermined value.

37. Apparatus for automatically matching a load circuit to a drive circuit, one of said circuits having a relatively high Q so that a real impedance component detector for the one circuit is incapable of accurately determining the real component because the real component is much less than an imaginary component of the circuit being matched, comprising a matching network connected between the circuits, said matching network including a series reactance and a shunt reactance, an impedance magnitude detector for the load circuit, means for detecting an inphase relationship for the voltage and current supplied by the drive circuit to the load circuit, a controller, said controller including: means for varying only one of the reactances at a time, first means for connecting the means for varying to be responsive to the impedance detector and unresponsive to the inphase detecting means while a first of the reactances is being varied, and second means responsive to a predetermined impedance value being detected for connecting the means for varying to be responsive to the inphase detecting means and unresponsive to the impedance detector while the other reactance is being varied, said predetermined impedance value being in a region of the Smith Chart where a real impedance component detector is incapable of accurately determining the real component.

38. The apparatus of claim 37 wherein the controller includes means for detecting the polarity of the phase between the voltage and current supplied by the drive circuit to the load circuit, and means for activating the second means only in response to the polarity detecting means indicating a predetermined polarity while the predetermined impedance value is detected.

39. Apparatus for automatically matching a load circuit to a drive circuit, one of said circuits having a relatively high Q so that a real impedance component detector for the one circuit is incapable of accurately determining the real component because the real component is much less than an imaginary component of the circuit being matched, comprising a matching network connected between the circuits, said matching network including a series reactance and a shunt reactance, means for varying the value of one of the reactances so that a real component as seen from the drive circuit remains constant while the one reactance is varied, means for sensing the impedance magnitude seen from the drive circuit while the one reactance is varied, means responsive to the sensed impedance magnitude reaching a predetermined value and unresponsive to the magnitude of the phase angle between the voltage and current supplied by the drive circuit to the matching circuit for maintaining the value of the one reactance constant and for varying the value of the other reactance so that the inverse real component seen from the drive circuit remains constant while the other reactance is varied, and means responsive to a change in the polarity of the phase angle between the voltage and current supplied by the drive circuit to the matching circuit while the other reactance is varied for preventing further variation of the values of the reactances until a new matching sequence is initiated.

40. Apparatus for automatically matching a load circuit to a drive circuit, one of said circuits having a relatively high Q so that a real impedance component detector for the one circuit is incapable of accurately determining the real component because the real component is much less than an imaginary component of the circuit being matched, comprising a matching network including a series reactance and a shunt reactance, both of said reactances being of the same type, means for varying the value of one of the reactances, means for effectively removing the other reactance from the network while the one reactance is being varied, means for sensing the impedance magnitude seen from the drive circuit while the other reactance is removed, means responsive to the sensed impedance magnitude reaching a predetermined value for: (a) maintaining the value of the one reactance at the value it had when the predetermined impedance magnitude value was reached, (b) connecting the other reactance to the network, and (c) varying the value of the other reactance, and means responsive to a change in the polarity of the phase angle between the voltage and current supplied by the drive circuit to the matching circuit while the other reactance is varied for preventing further variation of the values of the reactances until a new matching sequence is initiated.

* * * * *